US005232568A

United States Patent [19]

Parent et al.

[11] Patent Number: 5,232,568

[45] Date of Patent: Aug. 3, 1993

[54] RAZOR TECHNOLOGY

[75] Inventors: C. Robert Parent, Westwood; John Madeira, Assonet; Steve S. Hahn, Wellesley Hills, all of Mass.

[73] Assignee: The Gillette Company, Boston, Mass.

[21] Appl. No.: 719,793

[22] Filed: Jun. 24, 1991

[51] Int. Cl.[5] .......... C23C 14/34

[52] U.S. Cl. .......... 204/192.3; 204/192.15; 204/192.16; 30/346.53; 30/346.54

[58] Field of Search .......... 30/346.53, 346.54, 50, 30/346.55, 350; 427/27; 204/192.3, 192.15, 192.16; 76/104.1, 116, DIG. 8

[56] References Cited

U.S. PATENT DOCUMENTS

| | | | |
|---|---|---|---|
| 2,108,797 | 2/1938 | Comstock | 30/346.54 |
| 2,408,790 | 10/1946 | Mack | 30/346.54 |
| 3,263,328 | 8/1966 | Craig | 30/346.53 |
| 3,345,202 | 10/1967 | Kiss et al. | 30/346.53 |
| 3,349,488 | 10/1967 | Craig | 30/346.53 |
| 3,501,334 | 3/1970 | Flaherty | 30/346.54 |
| 3,518,110 | 6/1970 | Fischbein | 427/27 |
| 3,652,443 | 3/1972 | Fish | 204/298 |
| 3,743,551 | 7/1973 | Sanderson | 30/346.54 |
| 3,761,372 | 9/1973 | Sastri | 204/192 |
| 3,829,969 | 8/1974 | Fischbein | 30/346.54 |
| 3,890,704 | 6/1975 | Ferraro | 30/50 |
| 3,900,636 | 8/1975 | Curry et al. | 427/38 |
| 3,961,103 | 6/1976 | Aisenberg | 427/39 |
| 4,416,912 | 11/1983 | Bache | 427/13 |
| 4,434,188 | 2/1984 | Kamo | 427/39 |
| 4,490,229 | 12/1984 | Mirtich | 204/192 |
| 4,504,519 | 3/1985 | Zelez | 427/39 |
| 4,586,255 | 5/1986 | Jacobson | 30/41 |
| 4,720,918 | 1/1988 | Curry et al. | 30/346.55 |
| 4,816,286 | 3/1989 | Hirose | 427/39 |
| 4,816,291 | 3/1989 | Desphandey | 427/38 |
| 4,822,466 | 4/1989 | Rabalais et al. | 204/192.15 |
| 4,849,290 | 7/1989 | Fujimori | 428/408 |
| 4,902,535 | 2/1990 | Garg | 427/292 |
| 4,933,058 | 6/1990 | Bache et al. | 204/192.3 |

FOREIGN PATENT DOCUMENTS

WO/90/034-55 4/1990 World Int. Prop. O. .

OTHER PUBLICATIONS

Knight et al. "Characterization of diamond films by Raman spectroscopy", J. Mater. Res., vol. 4, No. 2 Mar./Apr. 1989.

*Primary Examiner*—Frank T. Yost
*Assistant Examiner*—Hwei-Siu Payer
*Attorney, Agent, or Firm*—Fish & Richardson

[57] ABSTRACT

A razor blade includes a substrate with a wedge-shaped edge, a layer of molybdenum on the tip and flanks of the wedge-shaped edge, the thickness of the molybdenum layer preferably being in the range of about 50-500 angstroms, and a layer of diamond or diamond-like material on the molybdenum layer that preferably has a thickness of about 200-2,000 angstroms and that defines a tip radius of less than about 500 angstroms, an aspect ratio in the range of 1:13-3:1, a hardness of at least thirteen gigapascals and an L5 wet wool felt cutter force of less than 0.8 kilogram.

12 Claims, 1 Drawing Sheet

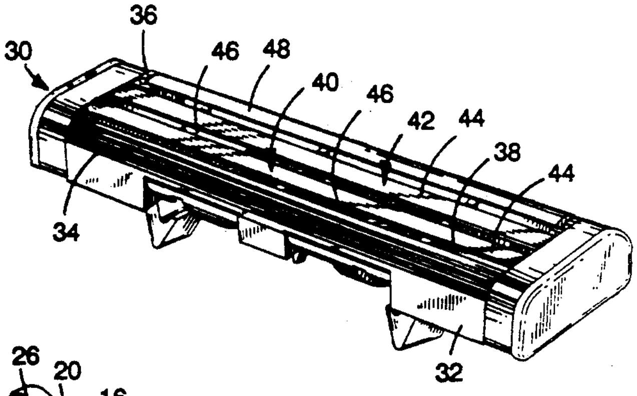
FIG. 2
FIG. 1
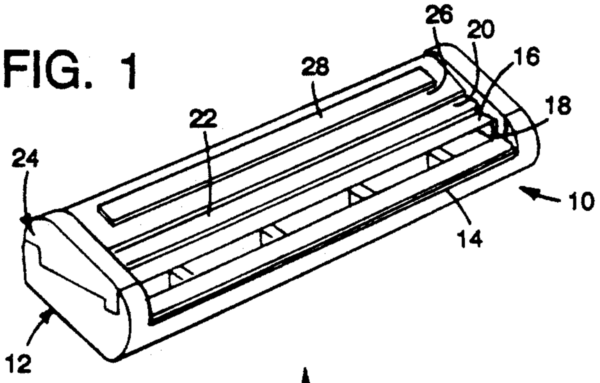
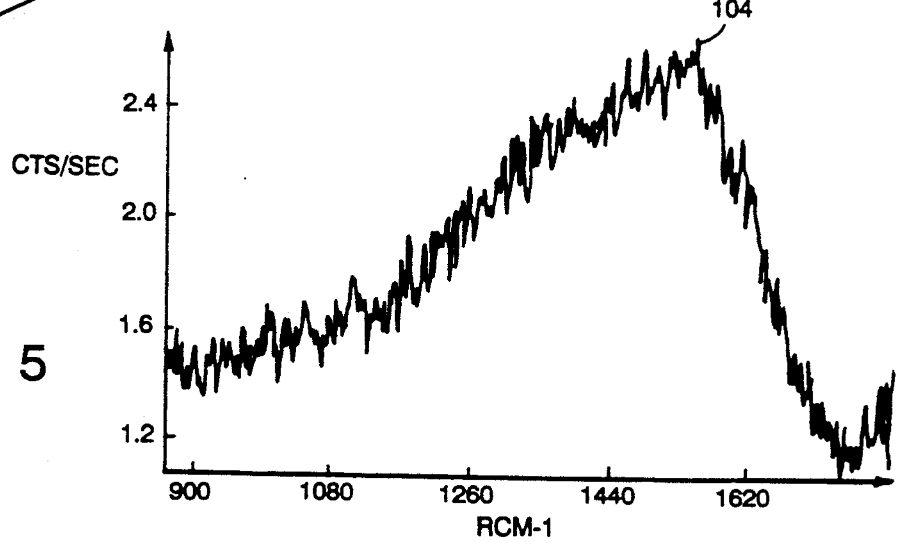
FIG. 5
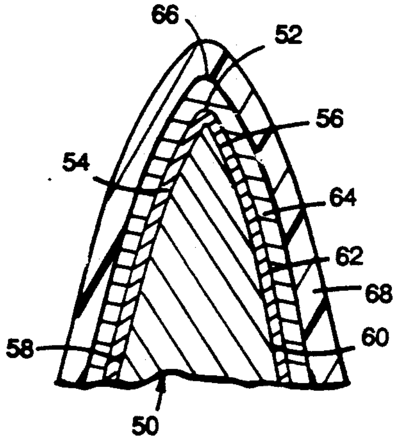
FIG. 3
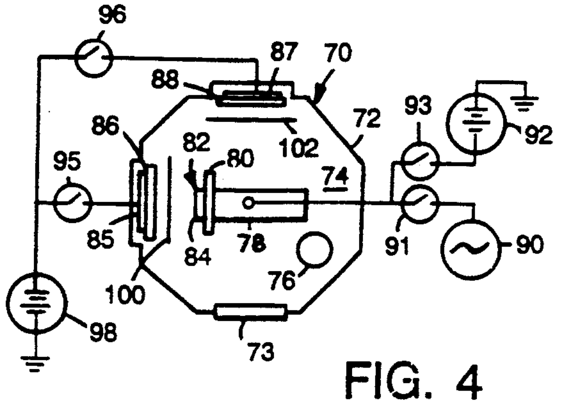
FIG. 4

RAZOR TECHNOLOGY

This invention relates to improved razors and razor blades and to processes for producing razor blades or similar cutting tools with sharp and durable cutting edges.

A razor blade typically is formed of suitable substrate material such as metal or ceramic and an edge is formed with wedge-shape configuration with an ultimate edge or tip that has a radius of less than about 1,000 angstroms, the wedge shaped surfaces having an included angle of less than 30°. As shaving action is severe and blade edge damage frequently results and to enhance shavability, the use of one or more layers of supplemental coating material has been proposed for shave facilitation, and/or to increase the hardness, strength and/or corrosion resistance of the shaving edge. A number of such coating materials have been proposed, such as polymeric materials, metals and alloys, as well as other materials including diamond and diamond-like carbon (DLC) material. Diamond and diamond-like carbon (DLC) materials may be characterized as having substantial sp3 carbon bonding; a mass density greater than 2.5 grams/$cm^3$; and a Raman peak at about 1331 $cm^{-1}$ (diamond) or about 1550 $cm^{-1}$ (DLC) Each such layer or layers of supplemental material desirably provides characteristics such as improved shavability, improved hardness, edge strength and/or corrosion resistance while not adversely affecting the geometry and cutting effectiveness of the shaving edge. However, such proposals have not been satisfactory due to the tendency of the diamond or diamond-like coated edge to have poor adhesion to and to peel off from the wedge-shaped edge of the substrate.

In accordance with one aspect of the invention, there is provided a razor blade comprising a substrate with a wedge-shaped edge, and a layer of diamond or diamond-like material on the wedge-shaped edge that preferably has a thickness of about 200–2,000 angstroms and that defines a tip radius of less than about 500 angstroms, an aspect ratio in the range of 1:1–3:1, a hardness of at least thirteen gigapascals and an L5 cutter force of less than 0.8 kilogram. The blade exhibits excellent shaving properties and long shaving life.

In particular embodiments, the razor blade substrate is steel; the wedge-shaped edge is formed by a sequence of mechanical abrading steps; the layer of diamond-like carbon material is formed by sputtering material from a high purity target of graphite concurrently with the application of an RF bias to the steel substrate; and the blade edge has excellent edge strength as evidenced by negligible dry wool felt cutter edge damage (less than ten small damage regions (each such small damage region being of less than twenty micrometer dimension and less than ten micrometer depth) and no damage regions of larger dimension or depth) as microscopically assessed.

In accordance with another aspect of the invention, there is provided a process for forming a razor blade that includes the steps of providing a substrate, forming on an edge of the substrate a wedge-shaped sharpened edge that has an included angle of less than 30° and a tip radius (i.e. the estimated radius of the largest circle that may be positioned within the ultimate tip of the edge when such ultimate tip is viewed under a scanning electron microscope at magnification of at least 25,000) preferably of less than 1,200 angstroms; and sputter depositing a layer of diamond or diamond-like material on the wedge-shaped edge while an RF bias is applied to the substrate to provide an aspect ratio in the range of 1:1–3:1, and a radius at the ultimate tip of the diamond or diamond-like material of less than about 500 angstroms.

In a particular process, the substrate is mechanically abraded in a sequence of grinding, rough-honing and finish-honing steps to form the sharpened edge; layers of molybdenum and diamond or diamond-like material are successively deposited by sputtering; the molybdenum layer having a thickness of less than about five hundred angstroms, and the diamond or DLC coating on the molybdenum coated cutting edge having a thickness of less than about two thousand hundred angstroms; the layer of diamond having a Raman peak at about 1331 $cm^{-1}$ and the layer of diamond-like carbon (DLC) material having a Raman peak at about 1550 $cm^{-1}$; substantial sp3 carbon bonding; and a mass density greater than 2.5 grams/$cm^3$; and an adherent polymer coating is applied on the diamond or DLC coated cutting edge.

In accordance with another aspect of the invention, there is provided a shaving unit that comprises blade support structure that has external surfaces for engaging user skin ahead and rearwardly of the blade edge or edges and at least one blade member secured to the support structure. The razor blade structure secured to the support structure includes a substrate with a wedge-shaped cutting edge, and a layer of diamond or diamond-like carbon material on the wedge-shaped cutting edge that has a radius at the ultimate tip of the diamond or diamond-like material of less than 500 angstroms and an aspect ratio in the range of 1:1–3:1.

In a particular shaving unit, the razor blade structure includes two steel substrates, the coated wedgeshaped edges are disposed parallel to one another between the skin-engaging surfaces; a molybdenum interlayer is between the steel substrate and the diamond or DLC coating; each molybdenum layer has a thickness of less than about five hundred angstroms; each diamond or DLC coating has a thickness of less than about two thousand angstroms; substantial sp3 carbon bonding; a mass density greater than 2.5 grams/$cm^3$; and a Raman peak at about 1331 $cm^{-1}$ (diamond) or about 1550 $cm^{-1}$ (DLC); and an adherent polymer coating is on each layer of diamond or diamond-like carbon material.

The shaving unit may be of the disposable cartridge type adapted for coupling to and uncoupling from a razor handle or may be integral with a handle so that the complete razor is discarded as a unit when the blade or blades become dull. The front and rear skin engaging surfaces cooperate with the blade edge (or edges) to define the shaving geometry. Particularly preferred shaving units are of the types shown in U.S. Pat. No. 3,876,563 and in U.S. Pat. No. 4,586,255.

Other features and advantages of the invention will be seen as the following description of particular embodiments progresses, in conjunction with the drawings, in which:

FIG. 1 is a perspective view of a shaving unit in accordance with the invention;

FIG. 2 is a perspective view of another shaving unit in accordance with the invention;

FIG. 3 is a diagrammatic view illustrating one example of razor blade edge geometry in accordance with the invention;

FIG. 4 is a diagrammatic view of apparatus for the practice of the invention; and FIG. 5 is a Raman spectrograph of DLC material deposited with the apparatus of FIG. 4.

DESCRIPTION OF PARTICULAR EMBODIMENTS

With reference to FIG. 1, shaving unit 10 includes structure for attachment to a razor handle, and a platform member 12 molded of high-impact polystyrene that includes structure defining forward, transversely-extending skin engaging surface 14. Mounted on platform member 12 are leading blade 16 having sharpened edge 18 and following blade 20 having sharpened edge 22. Cap member 24 of molded high-impact polystyrene has structure defining skin-engaging surface 26 that is disposed rearwardly of blade edge 22, and affixed to cap member 24 is shaving aid composite 28.

The shaving unit 30 shown in FIG. 2 is of the type shown in Jacobson U.S. Pat. No. 4,586,255 and includes molded body 32 with front portion 34 and rear portion 36. Resiliently secured in body 32 are guard member 38, leading blade unit 40 and trailing blade unit 42. Each blade unit 40, 42 includes a blade member 44 that has a sharpened edge 46. A shaving aid composite 48 is frictionally secured in a recess in rear portion 36.

A diagrammatic view of the edge region of the blades 16, 20 and 44 is shown in FIG. 3. The blade includes stainless steel body portion 50 with a wedge-shaped sharpened edge formed in a sequence of edge forming operations that include a grinding operation, a rough honing operation, and a finish honing operation that forms a tip portion 52 that has a radius typically less than 1,000 angstroms with finish hone facets 54 and 56 that diverge at an angle of about 14° and merge with rough hone facets 58, 60. Deposited on tip 52 and facets 54–60 is interlayer 62 of molybdenum that has a thickness of less than about 500 angstroms. Deposited on molybdenum interlayer 62 is outer layer 64 of diamond-like carbon (DLC) that has a thickness of less than about 2,000 angstroms, and an aspect ratio (the ratio of the distance from DLC tip 66 to stainless steel tip 52 and the width of the DLC coating 64 at tip 52) of less than about 3:1. Deposited on layer 64 is an adherent telomer layer 68.

Apparatus for processing blades of the type shown in FIG. 3 is diagrammatically illustrated in FIG. 4. That apparatus includes a DC planar magnetron sputtering system manufactured by Vac Tec Systems of Boulder, Col. that has stainless steel chamber 70 with wall structure 72, door 73 and base structure 74 in which is formed port 76 coupled to a suitable vacuum system (not shown). Mounted in chamber 70 is carousel support 78 with upstanding support member 80 on which is disposed a stack of razor blades 82 with their sharpened edges 84 in alignment and facing outwardly from support 80. Also disposed in chamber 70 are support structure 85 for target member 86 of molybdenum (99.99% pure) and support structure 87 for target member 88 of graphite (99.999% pure). Targets 86 and 88 are vertically disposed plates, each about twelve centimeters wide and about thirty-seven centimeters long. Support structures 78, 85 and 87 are electrically isolated from chamber 70 and electrical connections are provided to connect blade stack 82 to RF power supply 90 through switch 91 and to DC power supply 92 through switch 93; and targets 86 and 88 are connected through switches 95, 96, respectively, to DC magnetron power supply 98. Shutter structures 100 and 102 are disposed adjacent targets 86, 88, respectively, for movement between an open position and a position obscuring its adjacent target.

Carousel 78 supports the blade stack 82 with the blade edges 84 spaced about seven centimeters from the opposed target plate 86, 88 and is rotatable about a vertical axis between a first position in which blade stack 82 is in opposed alignment with molybdenum target 86 (FIG. 4) and a second position in which blade stack 82 is in opposed alignment with graphite target 88.

In a particular processing sequence, a stack of blades 82 (thirty centimeters high) is secured on support 80 (together with three polished stainless steel blade bodies disposed parallel to the target); chamber 70 is evacuated; the targets 86, 88 are cleaned by DC sputtering for five minutes; switch 91 is then closed and the blades 82 are RF cleaned in an argon environment for two and a quarter minutes at a pressure of ten millitorr, an argon flow of 200 sccm and a power of 1.5 kilowatts; the argon flow is then reduced to 150 sccm at a pressure of six millitorr in chamber 70; switch 93 is closed to apply a DC bias of −50 volts on blades 82; shutter 100 in front of molybdenum target 86 is opened; and switch 95 is closed to sputter target 86 at one kilowatt power for thirty-two seconds to deposit a molybdenum layer 52 of about 300 angstroms thickness on the blade edges 84. Shutter 100 is then closed, switches 93 and 95 are opened, and carousel 78 is rotated 90° to juxtapose blade stack 82 with graphite target 88. Pressure in chamber 70 is reduced to two millitorr with an argon flow of 150 sccm; switch 96 is closed to sputter graphite target 88 at 500 watts; switch 91 is closed to apply a 13.56 MHz RF bias of 320 watts (−220 volts DC self bias voltage) on blades 82, and concurrently shutter 102 is opened for seven minutes to deposit a DLC layer 54 of about 900 angstroms thickness on molybdenum layer 52. The DLC coating 54 had a tip radius of about 300 Angstroms, an aspect ratio of 1.6:1, and a hardness (as measured on the planar surface of an adjacent stainless steel blade body as measured with a Nanoindenter X instrument) of about thirteen gigapascals.

A coating 68 of polytetrafluoroethylene telomer is then applied to the DLC-coated edges of the blades in accordance with the teaching of U.S. Pat. No. 3,518,110. The process involved heating the blades in a neutral atmosphere of argon and providing on the cutting edges of the blades an adherent and friction-reducing polymer coating of solid PTFE. Coatings 52 and 54 were firmly adherent to the blade body 40 provided low wet wool felt cutter force (the lowest of the first five cuts with wet wool felt (L5) being about 0.6 kilogram), and withstood repeated applications of wool felt cutter forces (the lowest cutter force of the 496–500 cuts being about 0.76 kilogram), indicating that the DLC coating 54 is substantially unaffected by exposure to the severe conditions of this felt cutter test and remains firmly adhered to the blade body 40. Edge damage and delamination after ten cuts with dry wool felt as determined by microscopic assessment was substantially less than commercial chrome-platinum coated blades, there being less than four small edge damage regions (each such small damage region being of less than twenty micrometer dimension and less than ten micrometer depth) and no damage regions of larger dimension or depth. Resulting blade elements 44 were assembled in cartridge units 30 of the type shown in FIG. 2 and shaved with excellent shaving results.

In another processing sequence, chamber 70 is evacuated; the targets 86, 88 are cleaned by DC sputtering for five minutes; switch 91 is then closed and the blades 82 are RF cleaned in an argon environment for two and a quarter minutes at a pressure of ten millitorr, an argon flow of 200 sccm and a power of 1.5 kilowatts; the argon flow is then reduced to 150 sccm at a pressure of six millitorr in chamber 70; switch 93 is closed to apply a DC bias of −50 volts on blades 82; shutter 100 in front of molybdenum target 86 is opened; and switch 95 is closed to sputter target 86 at one kilowatt power for thirty-two seconds to deposit a molybdenum layer 52 of about 300 angstroms thickness on the blade edges 84. Shutter 100 is then closed, switches 93 and 95 are opened, and carousel 78 is rotated 90° to juxtapose blade stack 82 with graphite target 88. Pressure in chamber 70 is reduced to two millitorr with an argon flow of 150 sccm; switch 96 is closed to sputter graphite target 88 at 500 watts; switch 91 is closed to apply a 13.56 MHz RF bias of 320 watts (−220 volts DC self bias voltage) on blades 82, and concurrently shutter 102 is opened for five minutes to deposit a DLC layer 54 of about 600 angstroms thickness on molybdenum layer 52. The DLC coating 54 had a tip radius of about 400 Angstroms, an aspect ratio of 1.7:1, and a hardness (as measured on the planar surface of an adjacent stainless steel blade body as measured with a Nanoindenter X instrument) of about thirteen gigapascals. As illustrated in FIG. 5, Raman spectroscopy of the coating material 54 deposited in this process shows a broad Raman peak 104 at about 1543 $cm^{-1}$ wave number, a spectrum typical of DLC structure.

A telomer coating 68 was applied to the blade edges with a nitrogen atmosphere. The resulting coatings 52 and 54 were firmly adherent to the blade body 40 provided low wet wool felt cutter force (the lowest of the first five cuts with wet wool felt (L5) being about 0.6 kilogram), and withstood repeated applications of wet wool felt cutter forces (the lowest cutter force of the 496–500 cuts being about 0.76 kilogram), indicating that the DLC coating 54 is substantially unaffected by exposure to the severe conditions of this felt cutter test and remains firmly adhered to the blade body 40. Edge damage and delamination after ten cuts with dry wool felt as determined by microscopic assessment was substantially less than commercial chrome-platinum coated blades, there being less than five small edge damage regions (each such small damage region being of less than twenty micrometer dimension and less than ten micrometer depth) and no damage regions of larger dimension or depth. Resulting blade elements 44 were assembled in cartridge units 30 of the type shown in FIG. 2 and shaved with excellent shaving results.

While particular embodiments of the invention has been shown and described, various modifications will be apparent to those skilled in the art, and therefore, it is not intended that the invention be limited to the disclosed embodiments, or to details thereof, and departures may be made therefrom within the spirit and scope of the invention.

What is claimed is:

1. A process for forming a razor blade comprising the steps of providing a substrate, forming a wedge-shaped sharpened edge on said substrate that has an included angle of less than thirty degrees and a tip radius of less than twelve hundred angstroms; disposing said substrate and a solid target member in a chamber; and sputtering said solid target member to generate carbon atoms for forming a layer of diamond or diamond-like carbon material on said sharpened edge of said substrate from said carbon atoms from said solid target member while an RF bias is applied to said substrate; said layer of diamond or diamond-like carbon material having a radius at the ultimate tip of said diamond or diamond-like carbon material of less than 500 angstroms and an aspect ratio in the range of 1:1–3:1.

2. The process of claim 1 wherein said substrate is mechanically abraded in a sequence of grinding, rough-honing and finish-honing steps to form said sharpened edge.

3. The process of claim 2 wherein said finish-honing step forms facets that have an included angle of less than thirty degrees.

4. The process of claim 1 and further including the step of applying an adherent polymer coating on said diamond or diamond-like carbon coated sharpened edge.

5. The process of claim 1 and further including the step of depositing a layer of molybdenum on said sharpened edge; and said layer of diamond or diamond-like carbon material is deposited on said molybdenum layer.

6. The process of claim 5 wherein said molybdenum layer on said cutting edge is deposited to a thickness of less than about five hundred angstrom, and said diamond or diamond-like carbon coating on said molybdenum coated sharpened edge is deposited to a thickness of less than about two thousand angstroms.

7. The process of claim 1 wherein said solid target member is of high purity graphite; said layer of diamond or diamond-like carbon material is deposited in an argon atmosphere in an evacuated chamber in which said high purity graphite target and a shutter are located; said graphite target is energized; said RF bias is applied to said substrate; and said shutter is opened to deposit said layer of diamond or diamond-like carbon material on said sharpened edge while said RF bias is applied to said substrate.

8. The process of claim 7 and further including a molybdenum target in said chamber, and further including the step of depositing a molybdenum layer on said blade edge.

9. A process for forming a razor blade comprising the steps of providing a substrate, forming on said substrate a wedge-shaped edge that has an included angle of less than 30° and a tip radius less than 1,000 angstroms; disposing said substrate and a solid target member in a chamber; and sputtering said solid target member to generate carbon atoms for forming a layer of diamond or diamond-like carbon material on said wedge-shaped edge while an RF bias is applied to said substrate to provide a radius at the ultimate tip of said diamond or diamond-like carbon material of less than 500 angstroms and an aspect ratio in the range of 1:1–3:1.

10. The process of claim 9 wherein said solid target member is of high purity graphite; said layer of diamond or diamond-like material is deposited in an argon atmosphere in an evacuated chamber in which said high purity graphite target and a shutter are located; said graphite target is energized; said RF bias is applied to said substrate; and said shutter is opened to deposit said layer of diamond or diamond-like material on said edge while said RF bias is applied to said substrate.

11. The process of claim 9 wherein said diamond or diamond-like carbon coating on said wedge-shaped wedge is deposited to a thickness of less than about two thousand angstroms.

12. The process of claim 11 and further including the step of applying an adherent polymer coating on said diamond or diamond-like carbon coated wedge-shaped edge.

* * * * *